(12) United States Patent
Sauciuc et al.

(10) Patent No.: US 7,795,711 B2
(45) Date of Patent: Sep. 14, 2010

(54) MICROELECTRONIC COOLING APPARATUS AND ASSOCIATED METHOD

(75) Inventors: Ioan Sauciuc, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 11/255,678

(22) Filed: Oct. 20, 2005

(65) Prior Publication Data

US 2007/0090518 A1    Apr. 26, 2007

(51) Int. Cl.
*H01L 23/495* (2006.01)
(52) U.S. Cl. .............................. 257/675; 62/25; 136/203
(58) Field of Classification Search .......... 257/E23.082; 62/3.7, 3.2, 3.4, 3.6; 136/203, 204
See application file for complete search history.

(56) References Cited

U.S. PATENT DOCUMENTS 5,040,381 A * 8/1991 Hazen ........................ 62/3.2

6,588,217 B2 * 7/2003 Ghoshal ...................... 62/3.7
7,308,932 B2 * 12/2007 Doh et al. ................... 165/138

OTHER PUBLICATIONS

Biershenk et al—2004—Extending the Limits of Air Cooling With Thermoelectrically Enhanced Heat Sinks pp. 679-684.

* cited by examiner

*Primary Examiner*—Howard Weiss
*Assistant Examiner*—Steven H Rao
(74) *Attorney, Agent, or Firm*—Kathy J. Ortiz

(57) ABSTRACT

An apparatus and associated method to provide localized cooling to a microelectronic device are generally described. In this regard, according to one example embodiment, a cooling apparatus comprising a heat spreader and one or more thermoelectric cooler(s) thermally coupled to the heat spreader provides cooling to one or more hot spot(s) of a microelectronic device, the one or more thermoelectric cooler (s) having a single heat exchanging element of a single material.

23 Claims, 3 Drawing Sheets

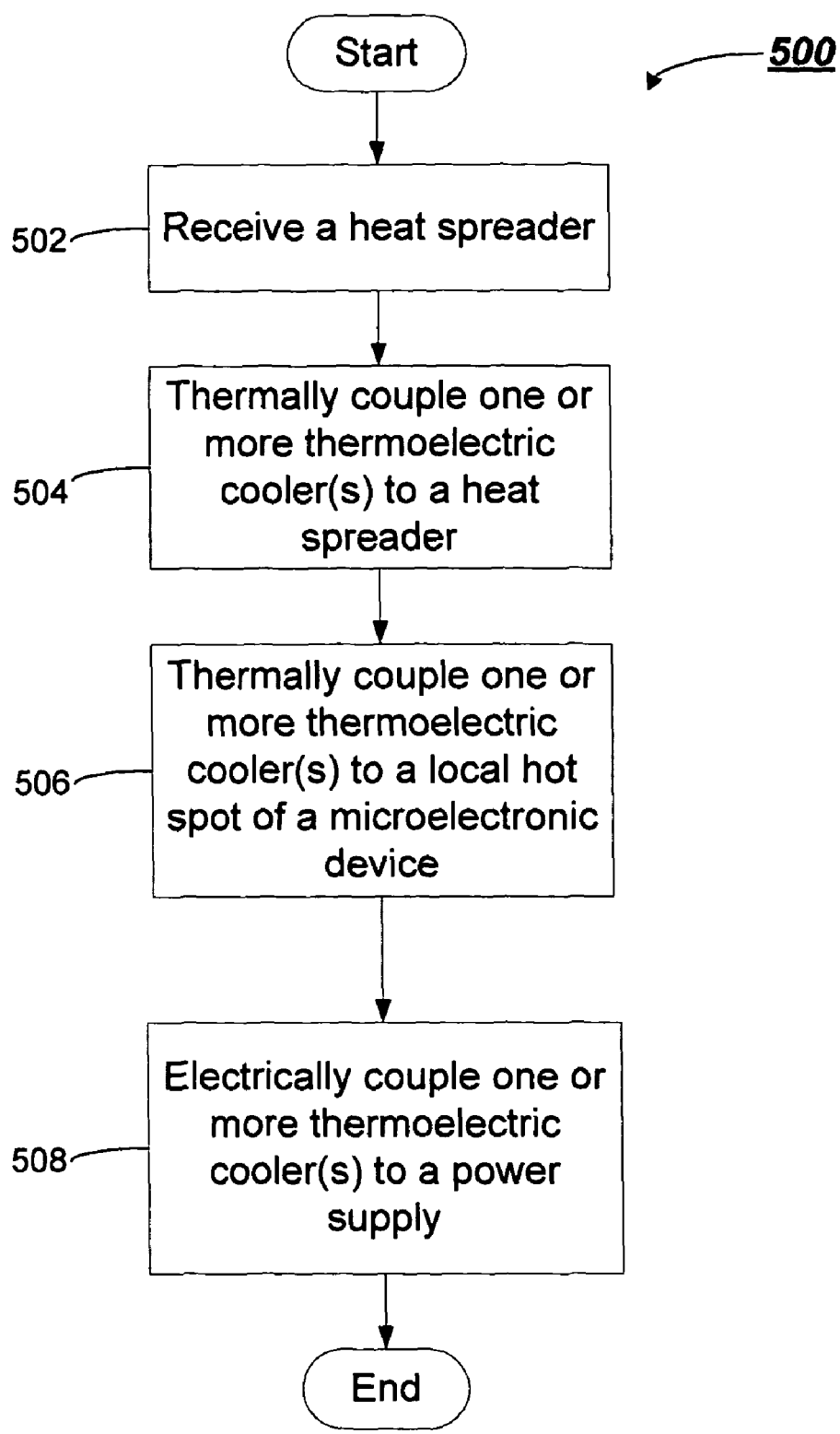

MICROELECTRONIC COOLING APPARATUS AND ASSOCIATED METHOD

TECHNICAL FIELD

Embodiments of the present invention are generally directed to microelectronic cooling systems and, more particularly, to an apparatus and associated method for localized microelectronic cooling.

BACKGROUND

Microelectronic devices generate heat as a result of the electrical activity of the internal circuitry. In order to reduce the damaging effects of this heat, thermal management systems have been developed to remove the heat. Such thermal management systems have included heat sinks, heat spreaders, fans, and various combinations that are adapted to thermally couple with the microelectronic device.

With the development of faster, more powerful, and more densely packed microelectronic devices such as processors, traditional methods of cooling may be ineffective, inefficient, or impractical. For example, processors may have local high heat flux regions called hot spots that create elevated and non-uniform temperature distributions within the die package and cooling system. Resultant overheating compromises the reliability and speed of such devices. Hot spots may need more cooling than traditional cooling methods can provide. In this regard, improved cooling technology is needed to remove the generated heat from localized hot spots of microelectronic devices to prevent overheating.

Thermoelectric coolers (TEC) and associated techniques are emerging as an improved thermal solution for high-power, densely populated microelectronic devices such as processors and other integrated circuit dies. A thermoelectric cooler may have a cold side where heat is absorbed by electrons as they pass from a low energy level in a p-type semiconductor element, to a higher energy level in an n-type semiconductor element. A power supply may provide the energy to move the electrons through the system. At a hot side, energy may be expelled to a heat sink as electrons move from a high energy level element (n-type) to a lower energy level element (p-type).

Unfortunately, heat may recirculate back from the hot side to the cold side through thermal and electrical insulation that may be positioned between the multiple n-type and p-type elements. Such recirculation of heat may diminish TEC efficiency. Furthermore, contact resistance between the power supply and electrically conductive materials may increase the amount of recirculated heat. Therefore, improvements are needed to prevent generation and recirculation of heat back to the cold side of the TEC to avoid overheating of microelectronic devices.

BRIEF DESCRIPTION OF THE DRAWINGS

Embodiments of the present invention are illustrated by way of example, and not by way of limitation, in the figures of the accompanying drawings in which like reference numerals refer to similar elements and in which:

FIG. 5 is a flow chart of an example method to fabricate an improved microelectronic cooling system, according to but one example embodiment.

DETAILED DESCRIPTION

Embodiments of a microelectronic cooling apparatus and corresponding methods are described herein. In the following description, numerous specific details are set forth to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
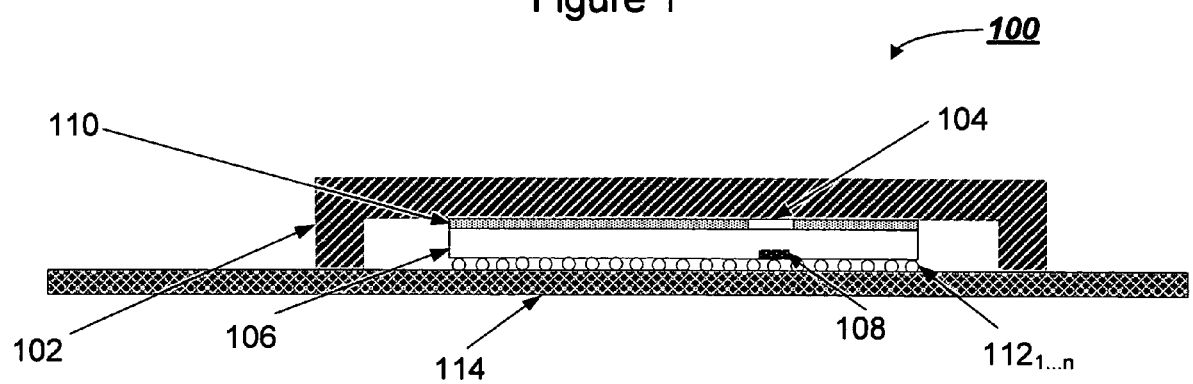
FIG. 1 is a side view of an example microelectronic cooling system using an example thermoelectric cooler applied to an example die package configuration, according to but one example embodiment.

FIG. 1 provides a side view of an example microelectronic cooling system 100 comprising an example localized TEC 104, heat spreader 102, microelectronic die 106, local hot spot 108, thermal interface material (TIM) 110, array of solder balls $112_{1...n}$ (where n represents a variable number of repeating structures), and substrate 114, each coupled as shown, according to but one embodiment. Array of solder balls $112_{1...n}$ may provide one or more electrical power and/or signal connections between die 106 and another component such as substrate 114.

In alternative embodiments of FIG. 1, microelectronic die 106 may be electrically coupled to various other systems, components, or devices such as another microelectronic die, for example.

In another embodiment, one or more TEC elements 104 may be thermally coupled to a heat spreader 102. As used in this description, "heat spreader" 102 is a general term that includes a variety of heat spreading devices such as an integral heat spreader (IHS), heat sinks, and/or heat pipes among others. Heat spreader 102 depicted in FIG. 1 is of the IHS variety, but the invention is not limited in this regard. TEC element(s) 104 may be located over, near or adjacent to one or more local hot spot(s) 108 to provide spot cooling. The length, width, and thickness of the TEC 104 may be selected for the power dissipation and temperature requirements of the targeted hot spot 108. A localized TEC element 104 may provide a benefit of providing directed cooling to particular hot spot(s) 108 of a microelectronic die while consuming less power and space than a TEC element that generally provides cooling for an entire die, for example. Such localized cooling may improve overall cooling efficiency. In one embodiment, a cold side of one or more TEC(s) 104 is thermally coupled to one or more hot spot(s) 108 of a microelectronic device 106 and a hot side of one or more TEC(s) 104 is thermally coupled to a heat spreader 102.

In one embodiment, the one or more TEC(s) 104 may comprise a single heat exchanging element made of a single type of material. The one or more TEC(s) 104 may consist of only one heat exchanging element. A heat exchanging element may refer to a unit material such as a semiconductor through which current may flow to carry heat away from a cold side to a hot side. The single heat exchanging element may continuously span to the edges of the TEC 104. The heat exchanging element may consist of only one material type. For example, the single heat exchanging element may consist solely of a p-type semiconductor. In another example, the single heat exchanging element may consist solely of an n-type semiconductor. In one embodiment, the single heat exchanging element may consist of Bismuth Telluride. According to another embodiment, the single heat exchanging element may consist of one of any suitable super-lattice materials. TEC 104 may comprise a variety of materials including, but not limited to, Bismuth Telluride, super-lattice materials, semiconductor materials, ceramics, and organic materials.

A suitable material for a single heat exchanging element may be selected according to ZT, the figure of merit of the material. ZT, or the figure of merit, may be a unitless coefficient equal to $(T \cdot \alpha^2)/(\rho \cdot k)$, where T=Temperature (K), $\alpha$=Seebeck coefficient (V/K), $\rho$=resistivity ($\Omega \cdot m$), and k=thermal conductivity (W/m·K). A higher ZT may be desirable to improve TEC 104 performance. Lower material resistivity may decrease energy wasted by Joule heating. Lower material thermal conductivity may be desirable to prevent recirculation of heat from the hot side through the heat exchanging element back to the cold side. In an embodiment, the single heat exchanging element may consist of a material that has a ZT figure of merit greater than 1. In another embodiment, a p-type semiconductor has a higher figure of merit than an n-type semiconductor and is selected for use as the sole material for a single heat exchanging element of a TEC 104.

Heat may circulate back to the cold side from the hot side of a TEC with multiple elements through any electrically insulative and/or thermally insulative material that may separate the multiple n-type and p-type elements. A TEC 104 with a single heat exchanging element may not require any electrical or thermal insulation to separate n-type and p-type elements as found in TEC(s) comprising such multiple elements. Accordingly, a TEC 104 with a single heat exchanging element may provide thermal efficiency benefits to a microelectronic cooling system 100 by eliminating electrically insulative and/or thermally insulative material used to separate multiple elements and, thus, prevent heat from recirculating from a hot side to a cold side of a TEC 104 through such a pathway.

Coupling one or more localized TEC(s) 104 to a heat spreader 102 may provide advantages over coupling to the backside of a die. First, coupling one or more TEC(s) 104 to a heat spreader 102 may provide greater temperature suppression while requiring lower input power than a TEC coupled to a die backside. Second, coupling one or more TEC(s) 104 to a heat spreader 102 may simplify the die fabrication process because TEC element(s) 104 may be attached to the heat spreader 102 in an independent process as opposed to being attached to the backside of a die during the die fabrication process. Finally, coupling one or more TEC(s) 104 to a heat spreader 102 simplifies power delivery to the TEC(s) 104 because power can be provided through the heat spreader 102 instead of the back side of a die 106, which is typically inactive.

A variety of suitable techniques may be used to couple one or more TEC(s) 104 to a heat spreader 102 including, but not limited to, sputtering, plating, screening, solder attachment, and direct attachment methods.

Solder attachment may involve any of various solderable materials, including fusible alloys such as lead or tin, to join parts. In one embodiment, an Indium-based alloy is used in a solder attachment process to couple one or more TEC(s) 104 to a heat spreader 102.

Direct attachment may involve a fabrication process to integrate a densely packed thin-film TEC 104 on a heat spreader 102 surface. Such process may comprise patterning a heat spreader 102 with electrodes and fabricating p and/or n type materials via sputtering, molecular beam epitaxy, crystal growth, or any other suitable method. In one embodiment, only p type material is used to fabricate a single element TEC 104 in a direct attachment process. Direct attachment may involve any suitable method for fabricating a TEC 104 on a heat spreader 102 surface.

Although TEC 104 is depicted as being coupled to the underside of heat spreader 102 and embedded in the TIM 110, other locations for coupling one or more TEC(s) to a heat spreader 102 are envisioned. For example, in an embodiment, one or more TEC(s) 104 may be coupled to any surface of a heat spreader 102. In another embodiment, one or more TEC(s) 104 may be coupled to the topside (i.e.—the surface farthest from the microelectronic device 106) of a heat spreader 102. In another example, one or more TEC(s) 104 may be coupled to multiple surfaces of multiple heat spreaders 102. Suitable locations for coupling one or more TEC(s) 104 to a heat spreader 102 will vary based on local cooling needs and design of the microelectronic device 106.

Figure 2:
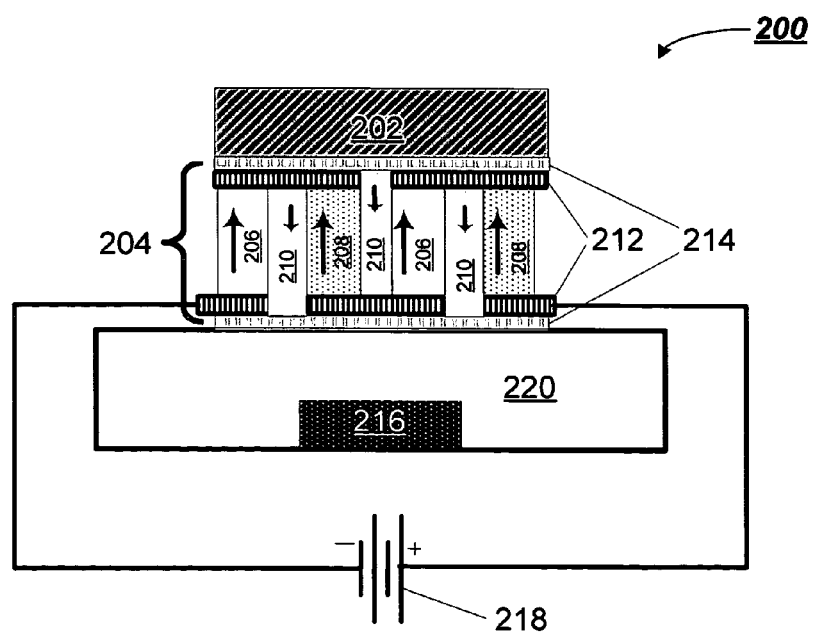
FIG. 2 is an exploded side view of an example microelectronic cooling system using an example thermoelectric cooler.

FIG. 2 is an exploded side view of an example microelectronic cooling system 200 using an example TEC 204 thermally coupled to heat spreader 202 and thermally coupled to microelectronic device 220 (not drawn to scale) with local hot spot 216 and electrically coupled to power supply 218. In accordance with FIG. 2, TEC 204 may comprise n-type elements 206, p-type elements 208, thermal and electrical insulation 210, electrical interconnects 212, and electrical insulation 214, each coupled as shown. Arrows within TEC 204 depict possible heat paths within TEC 204.

Heat (represented by arrows) may be carried through n-type elements 206 and p-type elements 208 from a cold side of TEC 204 that is thermally coupled to local hot spot 216 toward a hot side of TEC 204 that is thermally coupled to heat spreader 202. Some heat may recirculate back toward the cold side of TEC 204 through insulation 210. Such recirculation of heat may reduce the effectiveness of TEC 204, for example, by reducing the heat pumped from a microelectronic device 216 per unit of power applied to TEC 204. Electrical interconnects 212 may generate heat as a result of contact resistance, some of which may travel toward the cold side of TEC 204 through insulation 210.

Coupling one or more localized TEC(s) 204 to a heat spreader 202 may provide thermal benefits. If a hot side of a TEC 204 is thermally coupled to a heat spreader 202, hot side resistance may be reduced, which may enhance TEC 204 performance. Electrically coupling power leads 218 to the hot side of a TEC 204 (not shown in FIG. 2, FIG. 2 depicts power leads electrically coupled to a cold side of TEC 204) may result in a heat source or a conduction path. Either case may provide a thermal benefit over attaching power leads to the cold side. Additional power dissipation from a heat source would not be drawn into a cold side of TEC 204 as it would if a TEC 204 were placed on the backside of a die and the power leads were connected to a cold side of the TEC 204. A conduction path would conduct heat away from the TEC 204 rather than toward it.

Figure 3:
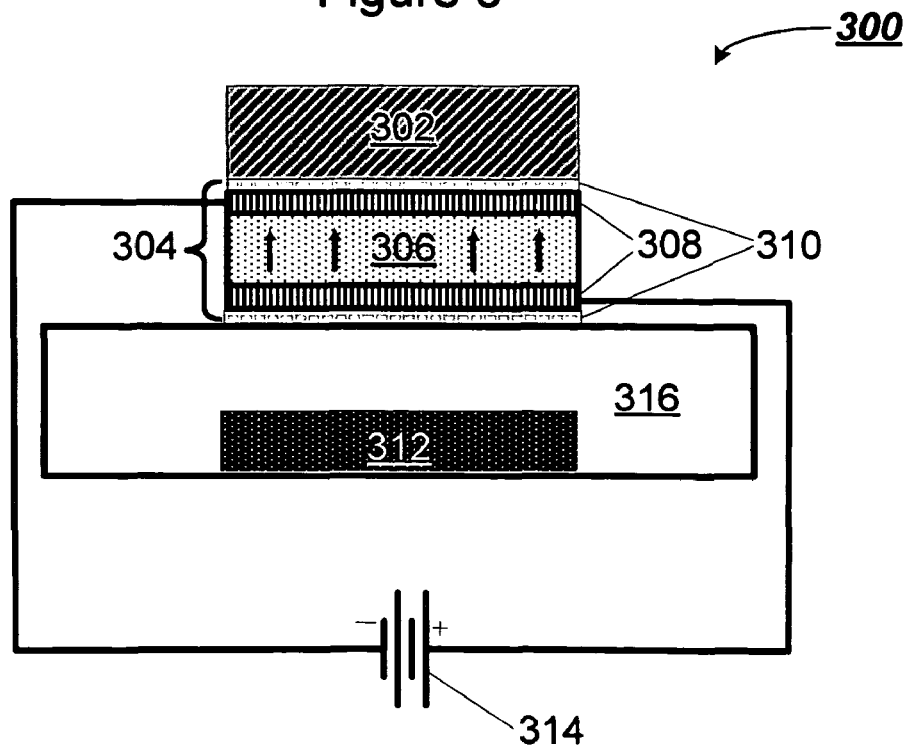
FIG. 3 is an exploded side view of an example microelectronic cooling system using an example single element thermoelectric cooler, according to but one example embodiment.

FIG. 3 is an exploded side view of an example microelectronic cooling system 300 using an example single element TEC 304 thermally coupled to heat spreader 302 and thermally coupled to microelectronic device 316 (not drawn to scale) with local hot spot 312 and electrically coupled to power supply 314. In accordance with FIG. 3, TEC 304 may comprise a single p-type element 306, electrical interconnects 308, and electrical insulation 310, each coupled as shown. Arrows within TEC 304 depict the flow of heat within TEC 304.

In one embodiment, arrows within TEC 304 depict heat carried from a cold side of TEC 304 that may be coupled to local hot spot 312 toward a hot side of TEC 304 that may be coupled to heat spreader 302. A power supply 314 may be coupled to TEC 304 through electrical interconnects 308 such that electrical current flows in the same direction as the flow of heat. Electrical current may flow in the same direction as the flow of heat for a single p-type heat exchanging element 306. Microelectronic cooling system 300 may also accord with previously described embodiments of microelectronic cooling system 100.

According to an embodiment, single heat exchanging element 306 may continuously span to the edges of the TEC 304 without encountering another heat exchanging element. Single element 306 may be the only element in TEC 304. Single element 306 may consist of a single material. The single material may be a p-type semiconductor. For example, the single heat exchanging element 306 may consist solely of a p-type semiconductor. In one embodiment, the single heat exchanging element 306 may consist of Bismuth Telluride. According to another embodiment, the single heat exchanging element 306 may consist of one of any suitable superlattice materials. TEC 304 may comprise a variety of materials including, but not limited to, Bismuth Telluride, superlattice materials, semiconductor materials, ceramics, and organic materials.

A suitable material for a single heat exchanging element 306 may be selected according to ZT, the figure of merit of the material. ZT, or the figure of merit, may be a unitless coefficient equal to $(T \cdot \alpha^2)/(\rho \cdot k)$, where T=Temperature (K), $\alpha$=Seebeck coefficient (V/K), $\rho$=resistivity ($\Omega \cdot m$), and k=thermal conductivity (W/m·K). A higher ZT may be desirable to improve TEC 304 performance. Lower material resistivity may decrease energy wasted by Joule heating. Lower material thermal conductivity may be desirable to prevent recirculation of heat from the hot side through the heat exchanging element 306 back to the cold side. In an embodiment, the single heat exchanging element 306 may consist of a material that has a ZT figure of merit greater than 1. In another embodiment, a p-type semiconductor has a higher figure of merit than an n-type semiconductor and is selected for use as the sole material for a single heat exchanging element 306 of a TEC 304. For a given semiconductor material, a p-type semiconductor may have a higher figure of merit than an n-type semiconductor and be selected for use as the sole material for a single element 306.

A TEC 304 with a single heat exchanging element 306 may not require any electrical or thermal insulation 210 to separate n-type and p-type elements as found in TEC(s) 204 comprising such multiple elements. Accordingly, a TEC 304 with a single heat exchanging element 306 may provide thermal efficiency benefits to a microelectronic cooling system 300 by eliminating electrically insulative and/or thermally insulative material 210 used to separate multiple elements 206, 208, and, thus, prevent heat from recirculating from a hot side to a cold side of a TEC 306 through such a pathway. Recirculation of heat may reduce the effectiveness of TEC 304, for example, by reducing the heat pumped from a microelectronic device 312 per unit of power applied to TEC 304 In one embodiment, TEC 304 does not comprise insulation such as insulation 210 to improve cooling efficiency.

Electrical interconnects 308 may comprise an electrically conductive material such as Cu. Such interconnects 308 may generate heat by mode of contact resistance of interface materials. An interface 308 material may be selected to inhibit heat generation by contact resistance.

In an alternative embodiment, the conductive elements of electrical interconnect 308 may be eliminated in a single element TEC 306 by electrically coupling power supply 314 wires directly to single heat exchanging element 306. Such embodiment may eliminate interface resistances and provide improved thermal performance of the TEC 306.

Figure 4:
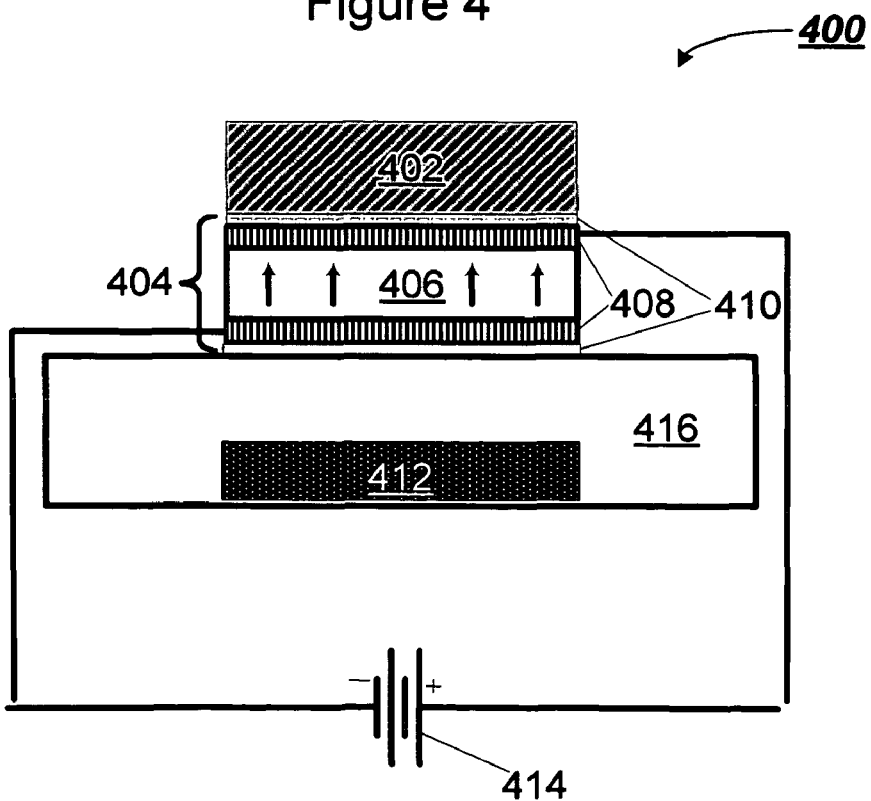
FIG. 4 is an exploded side view of another example microelectronic cooling system using an example single element thermoelectric cooler, according to but one example embodiment.

FIG. 4 is an exploded side view of an example microelectronic cooling system 400 using an example single element TEC 404 thermally coupled to heat spreader 402 and thermally coupled to microelectronic device 416 (not drawn to scale) with local hot spot 412 and electrically coupled to power supply 414. In accordance with FIG. 4, TEC 404 may comprise a single n-type element 406, electrical interconnects 408, and electrical insulation 410, each coupled as shown. Arrows within TEC 404 depict possible heat paths within TEC 404.

In one embodiment, arrows within TEC 404 depict heat carried from a cold side of TEC 404 that may be coupled to local hot spot 412 toward a hot side of TEC 404 that may be coupled to heat spreader 402. TECs 304, 404 may be thermally coupled to local hot spots 312, 412 by attachment to microelectronic device 316, 416. A power supply 414 may be coupled to TEC 404 through electrical interconnects 408 such that electrical current flows in the opposite direction as the flow of heat. Electrical current may flow in the opposite direction as the flow of heat for a single n-type element 406. Microelectronic cooling system 400 may accord with previously described embodiments of microelectronic cooling system 100.

According to an embodiment, single heat exchanging element 406 may continuously span to the edges of the TEC 404 without encountering another heat exchanging element. Single element 406 may be the only element in TEC 404. Single element 406 may consist of a single material. The single material may be an n-type semiconductor. For example, the single heat exchanging element 406 may consist solely of an n-type semiconductor. In one embodiment, the single heat exchanging element 406 may consist of Bismuth Telluride. According to another embodiment, the single heat exchanging element 406 may consist of one of any suitable super-lattice materials. TEC 404 may comprise a variety of materials including, but not limited to, Bismuth Telluride, super-lattice materials, semiconductor materials, ceramics, and organic materials.

A suitable material for a single heat exchanging element 406 may be selected according to ZT, the figure of merit of the material. ZT, or the figure of merit, may be a unitless coefficient equal to $(T \cdot \alpha^2)/(\rho \cdot k)$, where T=Temperature (K), $\alpha$=Seebeck coefficient (V/K), $\rho$=resistivity ($\Omega \cdot m$), and k=thermal conductivity (W/m·K). A higher ZT may be desirable to improve TEC 404 performance. Lower material resistivity may decrease energy wasted by Joule heating. Lower material thermal conductivity may be desirable to prevent recirculation of heat from the hot side through the heat exchanging element 406 back to the cold side. In an embodiment, the single heat exchanging element 406 may consist of a material that has a ZT figure of merit greater than 1.

A TEC 404 with a single heat exchanging element 406 may not require any electrical or thermal insulation 210 to separate n-type and p-type elements as found in TEC(s) 204 comprising such multiple elements. Accordingly, a TEC 404 with a single heat exchanging element 406 may provide thermal efficiency benefits to a microelectronic cooling system 400 by eliminating electrically insulative and/or thermally insulative material 210 used to separate multiple elements 206, 208, and, thus, prevent heat from recirculating from a hot side to a cold side of a TEC 406 through such a pathway. Recirculation of heat may reduce the effectiveness of TEC 404, for example, by reducing the heat pumped from a microelectronic device 412 per unit of power applied to TEC 404. In one embodiment, TEC 404 does not comprise insulation such as insulation 210 to improve cooling efficiency.

Electrical interconnects 408 may comprise an electrically conductive material such as Cu. In an alternative embodiment, the conductive elements of electrical interconnect 408 may be eliminated in a single element TEC 406 by electrically coupling power supply 414 wires directly to single heat exchanging element 406. Such embodiment may eliminate interface resistances and provide improved thermal performance of the TEC 406.

FIG. 5 is a flow chart 500 of an example method to fabricate an improved microelectronic cooling system, according to but one example embodiment. In an embodiment, a method may comprise receiving a heat spreader 502, thermally coupling one or more TEC(s) to a heat spreader 504, thermally coupling one or more TEC(s) to a local hot spot of a microelectronic device 506, and electrically coupling one or more TEC(s) to a power supply via electrical interconnects 508.

In one embodiment, manufacturing equipment may receive a heat spreader 502 and thermally couple one or more TEC(s) to a heat spreader 504. In another embodiment, one or more TEC(s) may be thermally coupled to a heat spreader 504 before one or more TEC(s) are thermally coupled to a local hot spot of a microelectronic device 506. In another embodiment, one or more TEC(s) may be thermally coupled to a local hot spot of a microelectronic device 506 before one or more TEC(s) are thermally coupled to a heat spreader 504. In another embodiment, manufacturing equipment receives a heat spreader 502 prior to thermally coupling one or more TEC(s) to a heat spreader and a different set of manufacturing equipment receives the heat spreader 502 prior to thermally coupling the one or more TEC(s) to a local hot spot of a microelectronic device 506.

Thermally coupling one or more TEC(s) to a heat spreader 504 may comprise thermally coupling a hot side of the one or more TEC(s) to a heat spreader. Thermally coupling one or more TEC(s) to a local hot spot of a microelectronic device 506 may comprise thermally coupling a cold side of the one or more TEC(s) to the one or more hot spot(s) of a microelectronic device.

In alternative embodiments, Method 500 may comprise electrically coupling the one or more TEC(s) to a power supply via electrical interconnects 508. In one embodiment, Method 500 may comprise electrically coupling the one or more TEC(s) 306, 406 to a power supply by electrically coupling the power supply directly to the single heat exchanging element 306, 406. Such embodiment may eliminate the need for electrical interconnects 308, 408 and thus eliminate interface resistances and provide improved thermal performance of the TEC 306, 406.

In various embodiments, thermally coupling one or more TEC(s) to a heat spreader 504 may be accomplished by sputtering, plating, screening, solder attachment, or direct attachment methods. In one embodiment, an Indium-based alloy is used in a solder attachment process to thermally couple one or more TEC(s) to a heat spreader 504. In another embodiment, a direct attachment method comprising patterning a heat spreader with electrodes and fabricating p or n type materials via sputtering, molecular beam epitaxy, and/or crystal growth is used to thermally couple one or more TEC(s) to a heat spreader 504.

One or more TEC(s) in method 500 may accord with various embodiments of one or more TEC(s) already described in cooling systems 100, 300, and 400.

Various operations may be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A microelectronic cooling apparatus comprising:
a heat spreader; and
a thermoelectric cooler thermally coupled to the heat spreader to provide cooling to one or more hot spot(s) of a microelectronic device, the thermoelectric cooler having a single solid heat exchanging element of a single material, wherein the single solid heat exchanging element continuously spans to the edges of the thermoelectric cooler without encountering another heat exchanging element.

2. A cooling apparatus according to claim 1, wherein a cold side of the thermoelectric cooler is thermally coupled to one or more hot spot(s) of a microelectronic device and a hot side of the thermoelectric cooler is thermally coupled to the heat spreader.

3. A cooling apparatus according to claim 1, wherein the microelectronic device is a die.

4. A cooling apparatus according to claim 1, wherein the thermoelectric cooler is thermally coupled to the heat spreader by direct attachment.

5. A cooling apparatus according to claim 1, wherein the thermoelectric cooler is thermally coupled to the heat spreader by solder attachment.

6. A cooling apparatus according to claim 5, wherein the solder attachment comprises an Indium-based alloy.

7. A cooling apparatus according to claim 1, wherein the single solid material has a figure of merit greater than 1.

8. A cooling apparatus according to claim 1, wherein the single solid material is Bismuth Telluride.

9. A cooling apparatus according to claim 1, wherein the single solid material is a p-type semiconductor.

10. A cooling apparatus according to claim 1, wherein the single solid material is an n-type semiconductor.

11. A cooling apparatus according to claim 1, wherein the thermoelectric cooler is electrically coupled to a power supply via electrical interconnects.

12. A cooling apparatus according to claim 1, wherein the thermoelectric cooler is electrically coupled to a power supply by coupling the power supply directly to the single heat exchanging element.

13. A method comprising:
    receiving a heat spreader; and
    thermally coupling a thermoelectric cooler to the heat spreader to provide cooling to one or more hot spot(s) of a microelectronic device, the thermoelectric cooler having a single, solid heat exchanging element of a single material, wherein the single solid heat exchanging element continuously spans to the edges of the thermoelectric cooler without encountering another heat exchanging element.

14. A method according to claim 13, wherein thermally coupling thermoelectric cooler to the heat spreader comprises:
    thermally coupling a hot side of the thermoelectric cooler to the heat spreader.

15. A method according to claim 13, further comprising:
    thermally coupling a cold side of the thermoelectric cooler to the one or more hot spot(s) of a microelectronic device.

16. A method according to claim 13, wherein thermally coupling thermoelectric cooler to a heat spreader comprises a direct attachment method.

17. A method according to claim 13, wherein thermally coupling the thermoelectric cooler to a heat spreader comprises a solder attachment method.

18. A method according to claim 13, wherein thermally coupling thermoelectric cooler to the heat spreader comprises thermally coupling the thermoelectric cooler to the heat spreader to provide cooling to one or more hot spot(s) of a microelectronic device, the thermoelectric cooler having a single solid heat exchanging element, the heat exchanging element comprising a single solid material with a figure of merit greater than 1.

19. A method according to claim 13 wherein thermally coupling thermoelectric cooler to the heat spreader comprises thermally coupling the thermoelectric cooler to the heat spreader to provide cooling to one or more hot spot(s) of a microelectronic device, the thermoelectric cooler having a single solid heat exchanging element, the heat exchanging element comprising a single solid material wherein the single solid material is Bismuth Telluride.

20. A method according to claim 13 wherein thermally coupling thermoelectric cooler to the heat spreader comprises thermally coupling the thermoelectric cooler to the heat spreader to provide cooling to one or more hot spot(s) of a microelectronic device, the thermoelectric cooler having a single solid heat exchanging element, the heat exchanging element comprising a single solid material wherein the single solid material is an n-type semiconductor.

21. A method according to claim 13 wherein thermally coupling thermoelectric cooler to the heat spreader comprises thermally coupling the thermoelectric cooler to the heat spreader to provide cooling to one or more hot spot(s) of a microelectronic device, the thermoelectric cooler having a single solid heat exchanging element, the heat exchanging element comprising a single solid material wherein the single solid material is a p-type semiconductor.

22. A method according to claim 13, further comprising:
    electrically coupling the thermoelectric cooler to a power supply via electrical interconnects.

23. A method according to claim 13, further comprising:
    electrically coupling the thermoelectric cooler to a power supply by coupling the power supply directly to the single solid heat exchanging element.

* * * * *